United States Patent [19]

Griffin et al.

[11] Patent Number: 4,571,545
[45] Date of Patent: Feb. 18, 1986

[54] SIX-PORT REFLECTOMETER

[75] Inventors: Eric J. Griffin, Malvern; Gordon J. Slack, Amesbury, both of England

[73] Assignee: The Secretary of State for Defense in Her Britannic Majesty's Government of the United Kingdom of Great Britian and Northern Ireland, London, England

[21] Appl. No.: 601,448

[22] Filed: Apr. 18, 1984

[30] Foreign Application Priority Data

Apr. 25, 1983 [GB] United Kingdom ............... 8311170

[51] Int. Cl.⁴ .......................................... G01R 27/06
[52] U.S. Cl. ................................ 324/58 B; 333/109; 333/113
[58] Field of Search ...................... 333/109, 113, 116; 324/58 B

[56] References Cited

U.S. PATENT DOCUMENTS 4,489,271 12/1984 Riblet .............................. 333/116 X

OTHER PUBLICATIONS

Weidman, A Semiautomated Six-Port for Measuring Millimeter-Wave Power and *Complex Reflection Coefficient*, IEEE Trans. on MTT, Dec. 1977, pp. 1083-1085.

*Primary Examiner*—Paul Gensler
*Attorney, Agent, or Firm*—William R. Hinds

[57] ABSTRACT

A six-port reflectometer includes first, second and third forward directional couplers to transmit power from a source for reflection at a measurement port. The couplers also divert incident and reflected wave samples for subsequent measurements. A fourth forward directional coupler receives samples of incident and reflected waves from the second coupler, the reflected waves being received directly and the incident waves via a waveguide appropriate to equalize wave path lengths. The first coupler is connected to a matched load and the third coupler to a short circuit. The first coupler may be a 6 dB device and the second, third and fourth couplers 3 dB devices. Power detectors are connected to the first, third and fourth couplers. The reflectometer has the band-width of its components.

9 Claims, 3 Drawing Figures

SIX-PORT REFLECTOMETER

This invention relates to a six-port reflectometer of the kind employed for measuring the voltage reflection coefficient (VRC) of electronic devices at microwave frequencies.

Six-port reflectometers are known, and comprise a waveguide junction which transmits radiation from a source to a load and directs different samples of the amplitude indicent on and reflected from the load to four power detectors. The detectors provide three relative power measurements obtained from the ratios of the outputs of three of the detectors to that of the fourth. The VRC of a device under test (DUT) is obtained by comparing the corresponding power ratio measurements to those produced by a series of calibration standards having known VRCs.

Specific designs of six-port reflectometers are discussed for example by Engen, IEEE Transactions, MTT-25, pp 1075–1080, December 1977, and by Hansonn et al., Proc. 11th European Microwave Conference, pp 501–506, 1980. Engen showed that reflectometer properties could by analysed with the aid of a diagram of the complex plane in which the reflection coefficient $\Gamma$ was displayed as a radius vector. He suggested that one of the four power detectors be used to indicate power incident to the unknown load, and that the complex numbers $q_1$, $q_2$ and $q_3$ associated with the other three detectors should be symmetrically distributed about the origin, ie separated by 120° C. Hansonn et al provided a specific implementation of these design principles, which employed a directional coupler connecting a power source to a power detector and to a symmetrical five-port junction. This junction is not commercially available as a broad-band device.

Fong Tom et al (1982 IEEE MTT-S Digest, pp 319–321) discuss diode detector characteristics for a 94 GHz six-port reflectometer. They also mention that a 200 mW power source is necessary to obtain adequate performance from a six-port reflectometer equipped with thermistor detectors, whereas diode detectors give greater sensitivity. This illustrates one of the desired reflectometer characteristics, that the reflectometer power requirements should be as low as possible to minimize costs. Against this, at low power, signal to noise ratios may become inadequate for acceptable measurement accuracy.

It is a further desideratum that the reflectometer be operative over as broad a frequency band as possible.

It is an object of the present invention to provide an alternative form of six-port reflectometer.

The present invention provides a six-port reflectometer including first, second and third directonal couplers arranged both to transmit electromagnetic waves from a source for incidence on a reflecting load and to divert samples of incident and reflected waves, a fourth directional coupler arranged to receive samples of incident and reflected waves from the second coupler, a waveguide arranged to transmit samples of incident waves from the second coupler to the fourth coupler, and four detectors arranged respectively to receive samples of incident waves from the first coupler, a combination of incident and reflected waves from the third coupler and two further combinations of incident and reflected waves from the fourth coupler. The reflectometer of the invention has the advantage that it may be constructed from commercially available components, and requires only four directional couplers and a waveguide. Engen (ibid) requires five couplers. The first coupler is preferably connected to a matched load to absorb diverted reflected waves, and the third coupler is preferably connected to a short circuit to reflect diverted incident waves. In a preferred embodiment, the waveguide has an angular length appropriate to ensure that the incident and reflected waves received by the fourth coupler have traversed equivalent physical path lengths. In this embodiment, the waveguide has the bandwidth of its components, all of which may be broadband. Selection of commercially available broadband components gives broadband performance.

The second, third and fourth couplers are preferably 3 dB devices. Conveniently, the first coupler is a 6 dB device, although a 4.8 dB device would be preferred if available. Forward directional couplers may be employed, but it is also possible to use those coupling in the backward, diagonal or perpendicular directions.

In a preferred embodiment of the invention, the reflectometer is formed from two plates having complementary formations providing E-plane transmission line couplers and waveguide. The reflectometer may have rectangular waveguide channels with couplers realized by intervening posts, the couplers being of branch guide form. Detectors may be provided by diodes with auxiliary circuitry mounted on dielectric material and located in the waveguide E-plane. The plates may be of metal or metal-coated dielectric.

In order that the invention might be more fully understood, one embodiment thereof will now be described, by way of example only, with reference to the accompanying drawings, in which.

Figure 1:
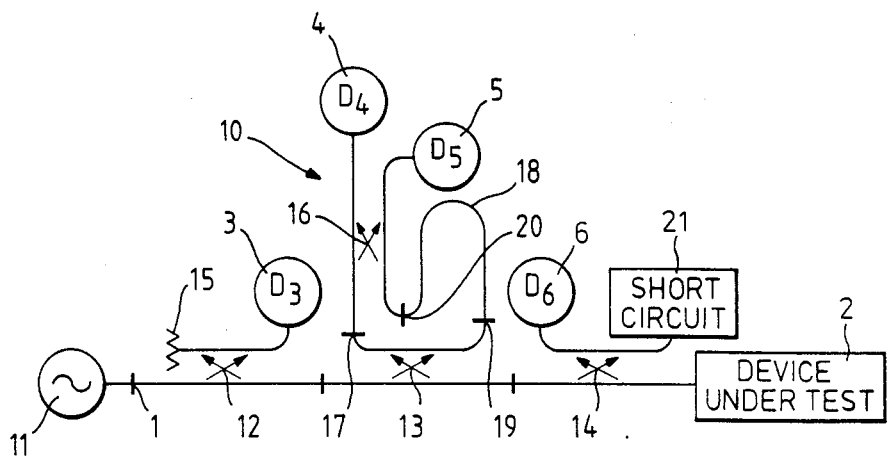
FIG. 1 is a schematic drawing of a reflectometer of the invention.

Referring to FIG. 1, a six-port reflectometer indicated generally by 10 has a first or input port 1 connected to a power source 11, and a second or measurement port shown diagrammatically at 2 connected to a device under test. Power from the source 11 is transmitted to the measurement port 2 via first, second and third forward directional couplers or quadrature hybrids indicated functionally by crossed arrows 12, 13 and 14 respectively. The first coupler 12 is connected to a matched load 15, and has an output port 3 at which a detector $D_3$ is located. The second coupler 13 is doubly connected to a fourth forward directional coupler 16, one connection at 17 being direct and the other connection being made via a length of waveguide 18 connecting at 19 and 20. The fourth coupler 16 provides output ports 4 and 5 at which detectors $D_4$ and $D_5$ are located. The third coupler 14, connected to the measurement port 2, is also connected to a reflecting short circuit 21 and provides an output port 6 at which a detector $D_6$ is located.

The reflectometer shown schematically in FIG. 1 operates as follows. The power source 11 provides electromagnetic waves for incidence on and reflection from a load connected to the measurement port 2. The couplers 12, 13 and 14 divert incident wave samples to the detector $D_3$, the waveguide 18 and the short circuit 21 respectively. Samples of waves reflected at the load measurement port 2 and the short circuit 21 pass to the detector $D_6$ via the third coupler 14. Reflected wave samples also pass to the second coupler 13, and thence to the fourth coupler 16 for combination with incident wave samples received via the waveguide 18. Diodes $D_4$ and $D_5$ detect two combinations of incident and reflected waves produced by the fourth coupler 16. Further reflected wave samples pass to the first coupler 12 for absorption in the matched load 15.

The theoretical analysis of the operation of the reflectometer will now be discussed with reference to the complex plane shown in FIG. 2.

The couplers 13, 14 and 16 form a five-port junction in which different samples of the waves incident on the reflected from the measurement port are transmitted to three detectors $D_4$, $D_5$ and $D_6$. It is assumed that matched components are employed so that the detector $D_3$ samples the power supplied to the five-port junction and the device under test (DUT).

If: $a_i$ and $b_i$ represent voltages associated with waves incident on and reflected from the ith port (i=1 to 6), $c_n$ and $t_n$ (n=1 to 4) are the coupling and transmission coefficients of the first to fourth couplers 12, 13, 14 and 16 respectively, $\phi$ is the angular length of the waveguide, and $\Gamma = a_2/b_2$ is the VRC of the DUT, then the ratios of the power $P_4$, $P_5$ and $P_6$ respectively absorbed by the detectors $D_4$, $D_5$ and $D_6$ to $P_3$ absorbed by $D_3$ are given by:

$$\left|\frac{b_4}{b_3}\right|^2 = \frac{P_4}{P_3} = c_2^2\, t_2^2\, t_3^2\, t_4^2 \left(\frac{t_1}{c_1}\right)^2 \left|\Gamma + \frac{c_3^2}{t_3^2} + j\frac{c_4 e^{-j\phi}}{t_2 t_3^2 t_4}\right|^2 \quad (1.1)$$

$$\left|\frac{b_5}{b_3}\right|^2 = \frac{P_5}{P_3} = c_2^2\, c_2^2\, t_2^2\, t_3^4 \left(\frac{t_1}{c_1}\right)^2 \left|\Gamma + \frac{c_3^2}{t_3^2} - j\frac{t_4 e^{-j\phi}}{c_4 t_2 t_3^2}\right|^2 \quad (1.2)$$

$$\left|\frac{b_6}{b_3}\right|^2 = \frac{P_6}{P_3} = c_3^2\, t_2^2\, t_3^2 \left(\frac{t_1}{c_1}\right)^2 |\Gamma - 1|^2 \quad (1.3)$$

Equations (1.1) to (1.3) represent $q_1$ to $q_3$ circles in the complex $\Gamma = x + jy$ plane (see eg Engen, ibid) of radii proportional to $\sqrt{P_4/P_3}$, $\sqrt{P_5/P_3}$, $\sqrt{P_6/P_3}$ intersecting in $\Gamma$, and the x,y co-ordinates of their centers depend only on the parameters of the five-port junction.

If:
(i) $c_4^2 = t_4^2 = 0.5$ for the fourth coupler 16, ie a 3 dB coupler, the centers of the circles represented by Equations (1.1) and (1.2) are at the ends of a line whose midpoint is on the real axis;
(ii) $\phi = \theta_2 + 2\theta_3$, where $t_2 = |t_2|e^{-j\theta_2}$ and $t_3 = |t_3|e^{-j\theta_3}$ for the second and third couplers 13 and 14, these centers become mirror images in the real axis at all frequencies at which $c_n$ and $t_n$ (n=2, 3 or 4) differ by 90°; and (iii) $c_2^3 = c_3^2 = 0.5$ for the second and third couplers 13 and 14, ie 3 dB couplers, the angle subtended at the origin by the corresponding circle centers is a nominal 141°. This approximates to the 120° suggested by Engen (ibid) as providing maximum resolution in finding $\Gamma$ from the intersection of all three circles.

With 3 dB couplers for the five-port junction, the circles described by Equations (1.1) to (1.3) become:

$$|\Gamma + 1 + j2\sqrt{2}|^2 = 32\left(\frac{c_1}{t_1}\right)^2 \frac{P_4}{P_3} \quad (2.1)$$

$$|\Gamma + 1 - j2\sqrt{2}|^2 = 32\left(\frac{c_1}{t_1}\right)^2 \frac{P_5}{P_3} \quad (2.2)$$

$$|\Gamma - 1|^2 = 8\left(\frac{c_1}{t_1}\right)^2 \frac{P_6}{P_3} \quad (2.3)$$

Figure 2:
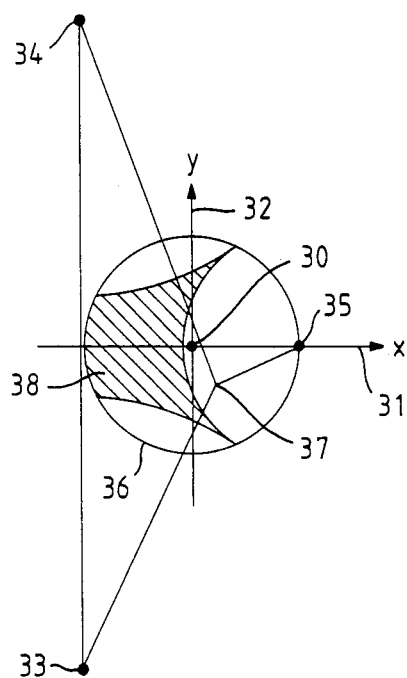
FIG. 2 is a drawing of the complex plane for representation of reflection coefficients.

FIG. 2 illustrates the technique of determining an unknown reflection coefficient $\Gamma$. The complex plane has an origin 30 and real and imaginary or x and y axes 31 and 32. The $q_1$, $q_2$ and $q_3$ or zero power points are at $-(1+j2\sqrt{2})$, $-(1-j2\sqrt{2})$ and $(1, J0)$, indicated by 33, 34 and 35 corresponding to $P_4$, $P_5$ and $P_6$ equal to zero respectively. A circle 36 indicates the locus of $|\Gamma| = 1$. An unknown reflection coefficient has a radius vector corresponding to the point 37, say $a+jb$. From Equations 2.1 and 2.3 the point 37 is distant $$4\sqrt{2}\ \frac{c_1}{t_1}\ \sqrt{\frac{P_4}{P_3}}$$

from the point 33, and $$2\sqrt{2}\ \frac{c_1}{t_1}\ \sqrt{\frac{P_4}{P_3}}$$

from the point 35. Measurements of $P_3$ to $P_6$ then yield the unknown reflection coefficient $a+jb$ as the intersection at 37 of circles of the foregoing radii centered on the points 33 to 35.

In FIG. 2 the phase datum has been taken as the output reference plane of the third coupler. In practice there will generally be a transition between this plane and the waveguide 18 appropriate for calibration and measurement (eg to precision waveguide fitted with dowelled flanges or a waveguide to coaxial line transformer). The reference plane for phase measurement is however established by calibration against reflection coefficient standards. The angular orientation of the x and y axes of FIG. 2 is accordingly irrelevant. Moreover, calibration establishes a description of the reflectometer normalized to the $Z_o$ common to the calibration standards. An assumption of matched lossless components is therefore likely to be sufficient.

Although forward directional couplers (metal waveguides) 12, 13 14 and 16 have been employed in the reflectometer 10, it is also possible to employ devices coupling in the backward direction (transmission line), diagonally (Lange coupler) or perpendicularly (as described by Collier).

Whereas the foregoing analysis relates to the use of 3 dB couplers 13, 14 and 16, this is not optimum for the first coupler 12. From inspection of FIG. 1 the VRC at port 1 is $\Gamma_1 = t_1^2 t_2^2 t_3^2(\Gamma + c_3^2/t_3^2)$. with 3 dB coupling factors for directional couplers 13 and 14, this becomes $\Gamma_1 = 0.25 t_1^2(\Gamma + 1)$. Maximum power is therefore delivered to the six-port reflectometer from a matched source when $\Gamma = -1$ (ie when the DUT is a short circuit). The appropriate choice of coupling factor for the first coupler 12 depends on whether the operational limit is this maximum available power from the source, or the power that may be absorbed by each detector $D_3$ to $D_6$ to give its full scale indication (FSI). Hereinafter it is assumed to be the latter. In Table 1, the FSI is normalized to unity to compare the power absorbed by the detectors and that demanded from a matched source for different coupling factors ($-20 \log_{10} c_1$) as the phase of $|\Gamma| = 1$ varies:

TABLE 1

|  | COUPLING FACTOR, dB | | | |
|---|---|---|---|---|
|  | 3 | 4.8 | 6.0 | 10.0 |
| $c_1^2$ | 0.5 | 0.33 | 0.25 | 0.1 |
| $t_1^2$ | 0.5 | 0.67 | 0.75 | 0.9 |
| Available source power, $P_s$ | 2.0 | 3.0 | 2.67 | 2.22 |
| Power absorbed by $D_3$, $P_3$ | 1.0 | 1.0 | 0.67 | 0.22 |
| For all $\|\Gamma\|=1$ Maxima of $P_4$ & $P_5$ | 0.5 | 1.0 | 1.0 | 1.0 |
| Minima of $P_4$ & $P_5$ | 0.125 | 0.25 | 0.25 | 0.25 |
| Maximum at $P_6$ | 0.5 | 1.0 | 1.0 | 1.0 |
| Minimum VRC at port 1, $\Gamma_1$ | 0.25 | 0.33 | 0.38 | 0.45 |

This table shows that, were a 4.8 dB coupler available then all four detectors would attain FSI as $|\Gamma|=1$ varies in phase. This would give maximum resolution of power indication and of determining the square roots of power ratios. In the example hereinbefore described a 6 dB coupler was used for the first coupler 12 as the nearest equivalent to 4.8 dB.

The likely effect on resolution of post detector instrumentation noise can be examined by first observing from FIG. 2 that $P_4 = P_6$ when $\Gamma = \frac{1}{3}(1 - j2\sqrt{2})$ and $P_5 = P_6$ when $\Gamma = \frac{1}{3}(1 + j2\sqrt{2})$. If the power from the source is reduced until the resolution is just acceptable for measurement of either of these two values of VRC, then it is likely to be so for all $|\Gamma| \leq 1$. This is because all $\Gamma$ in the shaded area 38 of FIG. 2 are overdetermined. They are located at the common intersection of three circles whose radii would be generated by detector indications above the acceptable minimum. Outside of this area, $\Gamma$ would be found from the intersection of only two such circles. This is however unlikely to degrade precision, because the third circle only serves to resolve the ambiguity of which of two precisely determined intersections is relevant. For example, at the extreme of $\Gamma = 1 + j0$, the area of indeterminacy is a curvilinear parallelogram bounded by the limits of FSI to noise ratios for $\sqrt{P_4/P_3}$ and $\sqrt{P_5/P_3}$. Although the equivalent limits for $\sqrt{P_6/P_3}$ are very much larger, this radius serves only to ensure that $\Gamma = 1 + j0$ is selected in computation in preference to $\Gamma = -3 + j0$.

The maximum diagonal of the curvilinear parallelogram bounded by the limits of FSI to noise ratios when $\Gamma = \frac{1}{3}(1 \pm j2\sqrt{2})$ dictates the diameter of a circle of uncertainty in finding $|\Gamma|$ because of xy axes may be arbitrarily rotated. Caculating for either of these values of VRC the radius of the circle of uncertainty $\Delta|\Gamma|$ assuming a 37 dB power signal-to-noise ratio (ie $10^{-4}$ in voltage discrimination) suggests a precision in $|\Gamma|$ of about $\Delta|\Gamma| = \pm 10^{-3}$. This in turn suggests that expression of measurment uncertainty would be appropriate in terms of $\Delta|\Gamma|$ only rather than in magnitude and phase, since the phase resolution will be $\pm \arctan (\Delta|\vartheta|/|\Gamma|)$. Moreover it also suggests that, for the reflectometer of the invention, there are particular values of load VRC that are most appropriate for determining the worse case resolution, these being short-circuit positions giving either $P_4 = P_6$ or $P_5 = P_6$.

The six-port reflectometer described with reference to FIG. 1 was assembled in WG22 size waveguide using commercially available couplers and thermistor detectors. With a short-circuit applied to measurement port 2 slid to positions giving the conditions $P_5 = P_6$ and to those giving minimum $P_6$, the VRC was measurd five times at different levels of input power. The standard deviation $\sigma$ of VRC magnitude measurement was calculated from the five results. These $\sigma$ values are tabulated for both conditions in Table 2.

TABLE 2

|  | Microwave power supplied to reflectometer dBm | | | | | |
|---|---|---|---|---|---|---|
|  | 12 | 0 | −3 | −7 | −10 | −13 |
| $10^4 \times \sigma$ for condition $P_5 = P_6$ | 2.02 | 3.97 | 1.99 | 3.04 | 4.56 | 37.37 |
| $10^4 \times \sigma$ for condition $P_6$ minimum | 2.16 | 2.09 | 3.19 | 0.67 | 4.83 | 5.54 |

The standard deviation in $|\Gamma|$ obtained with 50 μW ($-13$ dBm) supplied to the reflectometer can be seen from Table 2 to be nearly an order greater when $P_5 = P_6$ than when $P_6$ was a minimum, which appears to confirm that $\Gamma = \frac{1}{3}(1 + j2\sqrt{2})$ is an appropriate VRC value for measuring worst case resolution. The four directional couplers 12, 13, 14 and 16 were clamped to a heatsink (not illustrated) during the estimated ±1.9° C. ambient variations. This resulted in an apparent change of $|\Gamma|$ of up to 0.004 with 12 dBm supplied, but an arrangement of components allowing the waveguide 18 to be clamped to the heatsink was later devised.

It is seen that acceptable results are obtained with 50 μW supplied to the reflectometer. This is considerably less than the figure of 200 mW considered necessary by Fong Tom et al. (ibid) for thermistor detectors, and demonstrates the high sensitivity of which the invention is capable.

The reflectometer illustrated schematically in FIG. 1 may be assembled from any form of coupler and waveguide appropriate to a particular waveband, since it has the bandwidth of its components. In particular, the reflectometer has been tested and found viable using stripline couplers (metallic conductors on dielectric substrates) in the 200–300 MHz band, and rectangular waveguide couplers of size WG22 and WG27 for the 26.5–40 GHz and 75–110 GHz wavebands respectively. Other waveguide media are also suitable, eg microstrip, E-plane transmission line, image guide, insular guide and other dielectric waveguides, together with interconnections.

Figure 3:
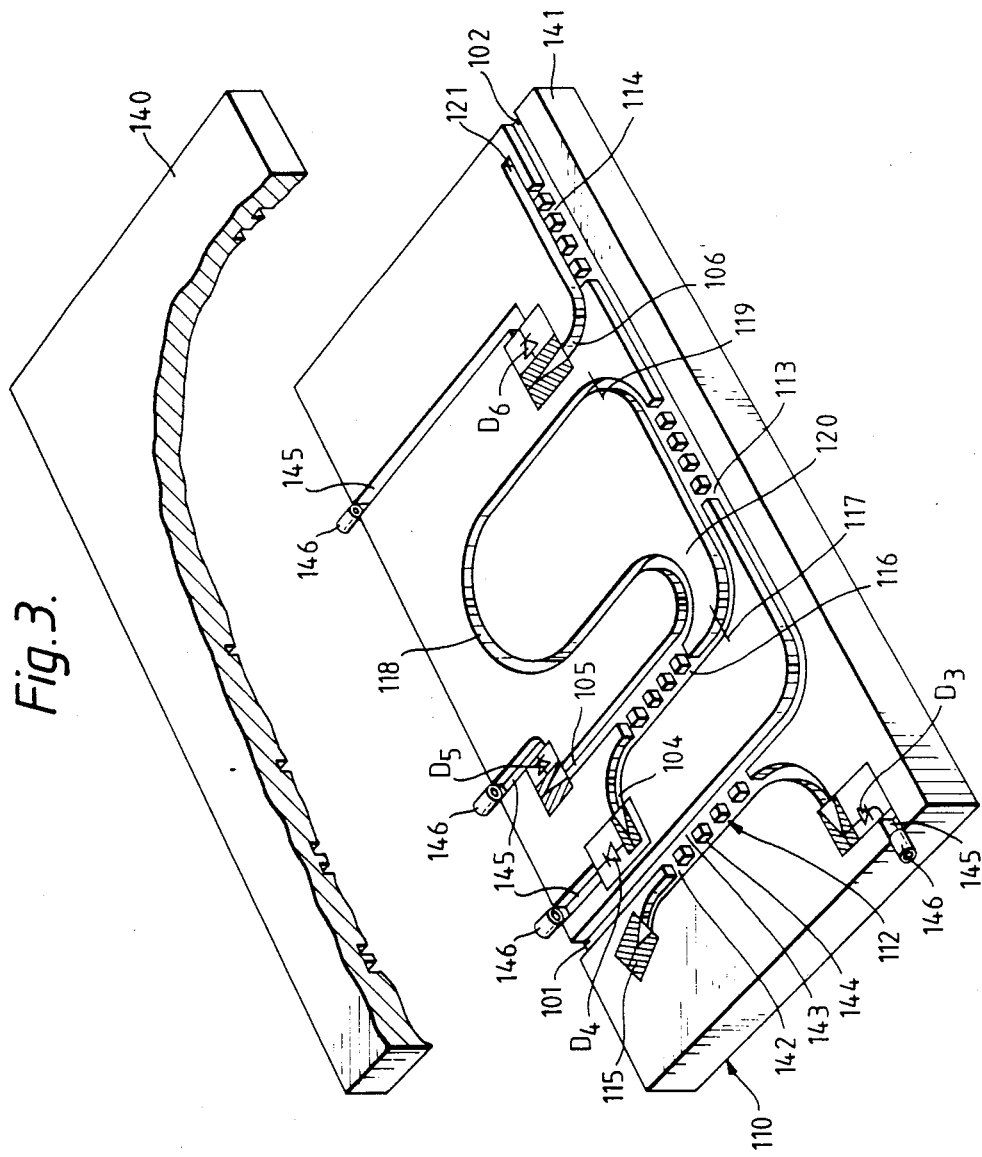
FIG. 3 is a perspective view of a practical embodiment of the invention of monobloc construction comprising two mating plates, the upper plate being shown withdrawn and cutaway.

In addition to its assembly from discrete components, the reflectometer of the invention may be of integral construction. Referring now to FIG. 3, in which parts equivalent to these shown in FIG. 1 have like references prefixed by 100, there is shown such a construction of monobloc form using E-plane transmission line components. The reflectometer 110 comprises upper and lower plates 140 and 141 respectively, which together form a planar coupler/waveguide structure divided at the E-plane into two complementary halves. The lower plate 141 has branch guide coupler portions 112, 113, 114 and 116 each comprising adjoining rectangular grooves with intervening posts, eg grooves 142, 143 and posts 144 for the first coupler 112. A waveguide channel 118 joins the second and fourth couplers 113 and 116. Diode detector $D_3$ to $D_6$ together with their auxiliary circuitry are indicated schematically adjacent the respective couplers 112, 114 and 116. The detectors $D_3$ to $D_6$ and their circuitry are mounted on dielectric sheets (not shown) mounted in the E-plane of the structure 140/141. Signal outputs from the detectors are obtained via channels 145 and coaxial connectors 146. Such detector circuitry is well-known in the art and will not be described further. The input port 101, measurement port 102, matched load 115 and short circuit 121 are as indicated schematically on the lower plate 141 with complementary formations (not shown) on the upper plate 140.

The FIG. 3 embodiment of the invention may be formed from two metal plates, or alternatively from metal-coated dielectric material. Since a metal construction provides higher thermal conductivity, it may be preferred if temperature control is required. As alternatives to diode detectors, thermistors or pyroelectric detectors may be employed. In particular, Takashi Iwasaki et al (IEEE Trans, Vol IM-28 No 1, March 1979) describe $PVF_2$ pyroelectric detectors. When constructed in waveguide size WG27 for the 75-110 GHz band, the FIG. 3 embodiment should be approximately a $28 \times 16 \times 4$ cm rectangular block.

In specific realizations of the invention, it may be convenient to join the forward directional couplers by short lengths of waveguide rather than directly. If so, the length of the waveguide 18 or 118 is adjusted to preserve the equal path length experienced by incident and reflected waves reaching the fourth coupler 16 or 116. This adjusts for any short waveguide length connection couplers 13 and 14.

We claim:

1. A six-port reflectometer including
   (1) first, second and third directional coupler means arranged in sequence to provide a series path for transmission of electromagnetic waves from a source of incidence on a reflecting load and to divert samples of incident and reflected waves,
   (2) a fourth directional coupler means arranged to receive a combination of incident and reflected waves from the second coupler means,
   (3) a waveguide arranged to transmit incident waves from the second coupler means to the fourth coupler means, and
   (4) four detector means arranged respectively to receive a proportion of incident waves from the first coupler means, a combination of incident and reflected waves from the third coupler means and two further combinations of incident and reflected waves from the fourth coupler means.

2. A six-port reflectometer according to claim 1 wherein the first coupler means is connected to a matched load for absorption of diverted reflected waves.

3. A six-port reflectometer according to claim 2 wherein the third coupler means is connected to a short circuit for reflection of diverted incident waves.

4. A six-port reflectometer according to claim 3 wherein the waveguide angular length is appropriate to ensure that incident and reflected waves received by the fourth coupler means traverse equivalent physical path lengths.

5. A six-port reflectometer according to claim 4 wherein the second, third and fourth coupler means are 3 dB couplers.

6. A six-port reflectometer according to claim 5 wherein the first coupler means is a 6 dB device.

7. A six-port reflectometer according to claim 6 wherein the coupler means are forward directional couplers.

8. A six-port reflectometer according to claim 7 formed from two plates having complementary formations providing E-plane transmission line couplers and waveguide.

9. A six-port reflectometer according to claim 8 having rectangular waveguide channels with branch guide couplers realised by interchannel posts.

* * * * *